(12) United States Patent
Lou (10) Patent No.: US 11,262,400 B2
(45) Date of Patent: Mar. 1, 2022

(54) SHIELDING FOR PROBING SYSTEM

(71) Applicant: TECAT TECHNOLOGIES (SUZHOU) LIMITED, Suzhou (CN)

(72) Inventor: Choon Leong Lou, Singapore (SG)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 33 days.

(21) Appl. No.: 16/864,861

(22) Filed: May 1, 2020

(65) Prior Publication Data
US 2021/0311111 A1 Oct. 7, 2021

(30) Foreign Application Priority Data
Apr. 7, 2020 (CN) .............................. 202010263758

(51) Int. Cl.
*G01R 31/28* (2006.01)
*G01R 1/067* (2006.01)
(52) U.S. Cl.
CPC ..... *G01R 31/2886* (2013.01); *G01R 1/06755* (2013.01); *G01R 31/2865* (2013.01)
(58) Field of Classification Search
CPC .. G01R 31/2886; G01R 1/18; G01R 31/2887; G01R 31/2889; G01R 1/07392; G01R 31/2865; G01R 1/06705; G01R 1/0416; G01R 1/06794; G01R 31/2851; G01R 1/07342; G01R 1/025; G01R 31/2875; G01R 31/2891; G01R 19/0053; G01R 31/2862; G01R 1/06711; G01R 31/2874; G01R 1/04; G01R 1/067; G01R 1/06733; G01R 1/06772; G01R 31/002; G01R 31/2808; G01R 31/2855; G01R 31/286; G01R 31/281; G01R 31/307; G01R 1/0408; G01R 31/2879; G01R 29/26; G01R 31/2831; G01R 31/2868; G01R 31/2877; G01R 31/2893; G01R 1/06727; G01R 31/129; G01R 31/2863; G01R 31/311;

(Continued)

(56) References Cited

U.S. PATENT DOCUMENTS

| 5,266,889 A | 11/1993 | Harwood et al. |
| 5,521,522 A * | 5/1996 | Abe .................... G01R 1/07314 324/750.23 |

(Continued)

FOREIGN PATENT DOCUMENTS

| TW | 201331605 A | 8/2013 |
| TW | 201725393 A | 7/2017 |

(Continued)

OTHER PUBLICATIONS

Office Action and Search Report issued in TW 10914429 dated Jul. 27, 2021, 5 pages.

*Primary Examiner* — Vinh P Nguyen
(74) *Attorney, Agent, or Firm* — Muncy, Geissler, Olds & Lowe, P.C.

(57) ABSTRACT

A probing system includes a chuck configured to support a device under test (DUT); a probe card disposed above the chuck and including a plurality of probes protruding from the probe card toward the chuck; and a platen disposed between the chuck and the probe card and configured to support the probe card, wherein the chuck includes a shielding member disposed between the platen and the chuck.

19 Claims, 9 Drawing Sheets

(58) Field of Classification Search
CPC ...... G01R 31/31727; G01R 31/318505; G01R 31/31905; H01L 21/68785; H01L 21/67207; H01L 21/67748
See application file for complete search history.

(56) References Cited

U.S. PATENT DOCUMENTS

| | | | |
|---|---|---|---|
| 5,532,609 A | 7/1996 | Harwood et al. | |
| 5,604,444 A | 2/1997 | Harwood et al. | |
| 5,663,653 A | 9/1997 | Schwindt et al. | |
| 6,194,907 B1 * | 2/2001 | Kanao | G01R 31/2886 324/627 |
| 7,221,146 B2 * | 5/2007 | Dunklee | G01R 31/2886 324/754.01 |
| 7,960,981 B2 * | 6/2011 | Strom | G01R 3/00 324/750.23 |
| 2013/0147506 A1 | 6/2013 | Yamada | |
| 2015/0168449 A1 | 6/2015 | Yamada | |

FOREIGN PATENT DOCUMENTS

| | | |
|---|---|---|
| TW | I604198 B | 11/2017 |
| WO | WO-2017123397 A1 | 7/2017 |

\* cited by examiner

SHIELDING FOR PROBING SYSTEM

TECHNICAL FIELD

The present disclosure relates to a probing system including a chuck configured to support a device under test (DUT) thereon, and particularly relates to the chuck having a shielding member extendable from the circumferential fixture of the chuck, disposed in the chuck or being part of the chuck and surrounding the DUT. Further, the present disclosure relates to a method of operating the probing system for probing the DUT disposed on a chuck, and particularly relates to a method of probing the DUT surrounded by the shielding member extendable from and the chuck, disposed in the chuck or being part of the chuck under wide varying temperature, pressure, humidity, or gas filled environment. This shielding member of the chuck minimizes the volume space of the chamber required for purging with dry air, gases or any environment required for testing.

DISCUSSION OF THE BACKGROUND

After fabrication, a semiconductor device, such as a wafer, is tested by a probing system. During the testing or probing, the semiconductor device has to be under specific conditions such as a predetermined temperature, pressure, humidity, or gas filled environment. However, such specific conditions may be difficult to maintain consistency for the semiconductor wafer during the testing or probing. Therefore, accuracy of the testing of the semiconductor device may be decreased.

For example, an enclosure is used to surround and shield a whole probing system. However, it is very difficult or in fact technically impossible to shield such a large shielding chamber by the probing system. In another example, an enclosure is used to surround and shield a chuck and a semiconductor wafer on the chuck. Although a space of such shielding chamber is smaller than the one for the whole probing system, it is still difficult to securely shield the chuck and the semiconductor wafer.

Accordingly, there is a continuous need to improve a configuration of the probing system. Testing under different environment is difficult to achieve with existing probing system or may require high gas flow, equipment requiring high energy consumption, use of high-volume gas, etc. to fill up or purge the environment of the probing system with large chamber. The large chamber is required for the entire operational movement of the chuck inside the large chamber.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probing system. The probing system includes a chuck configured to support a device under test (DUT); a probe card disposed above the chuck and including a plurality of probes protruding from the probe card toward the chuck or plurality of probe manipulators with single probe; and a platen disposed between the chuck and the probe card or probe manipulator and configured to support the probe card or probe manipulator, wherein the chuck includes a shielding member encircling the DUT and disposed between the platen and the chuck.

In some embodiments, the shielding member encircles and protrudes from the surrounding of the chuck toward the platen.

In some embodiments, the shielding member is extendable from and retractable into the chuck, and if application requires, will have vacuum suction increasing the shielding between the DUT and the surrounding environment.

In some embodiments, the chuck includes a slot indented into the chuck edge and configured to allow part or all of the shielding member to be disposed within the slot.

In some embodiments, the shielding member is in contact with the platen to provide complete isolation of the DUT with the surrounding environment.

In some embodiments, the shielding member is substantially orthogonal to a surface of the chuck.

In some embodiments, a height of the shielding member can be extended or depressed that is substantially same as a distance between the chuck and the platen.

In some embodiments, a height of the shielding member is substantially greater than a thickness of the DUT wafer ensuring sufficient clearance between the wafer and the platen.

In some embodiments, the DUT is disposed within a chamber defined by the chuck, the shielding member, the platen and the probe card or probe manipulator.

In some embodiments, the shielding member includes a first end and a second end opposite to the first end, the first end is in contact with the platen, and the second end is in contact with the chuck.

In some embodiments, the shielding member is isolated from the probe card or the platen.

In some embodiments, a cover enclosing the probe card or probe manipulator ensures complete shielding of the DUT from the surrounding environment.

Another aspect of the present disclosure provides a method of operating a probing system. The method includes providing a chuck including a shielding member extendable from and disposed in circumferential fixture of the chuck; disposing a device under test (DUT) on the chuck and surrounded by the shielding member; providing a probe card above the DUT and the chuck; disposing a platen between the probe card and the chuck, and extending the shielding member from the chuck toward the platen, thereby the shielding member contacts the platen or the probe card.

In some embodiments, the method further comprises retracting the shielding member into the circumferential fixture of chuck and away from the platen. This can either be done automatically or through raising the chuck into the platen.

In some embodiments, the extension of the shielding member is performed prior to the retraction of the shielding member.

In some embodiments, a chamber defined by the chuck, the shielding member, the platen and the probe card or probe manipulator with cover, is formed after the retraction of the shielding member.

In some embodiments, the method further comprises increasing or decreasing a temperature of the chamber, or filling the chamber with an inert gas.

In some embodiments, the method further comprises increasing or decreasing the humidity of the chamber by filling with air of varying wetness.

In some embodiments, the method further comprises increasing or decreasing a pressure of the chamber by filling with air or gases of higher or lower pressure.

In some embodiments, the method further comprises moving the chuck toward the probe card prior to the retraction of the shielding member.

In some embodiments, the method further comprises probing the DUT after the extension of the shielding member.

In some embodiments, the shielding member is retracted into the chuck after the probing of the DUT.

The foregoing has outlined rather broadly the features and technical advantages, especially in reducing the volume space of the shielded chamber by greater than 90% of the present disclosure, in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

In the present disclosure, a probing system is disclosed. The probing system includes a chuck configured to support a device under test (DUT) and a probe card disposed above the chuck. The chuck includes a shielding member extendable from and retractable into the chuck. The shielding member is extended from the chuck to form a chamber surrounding the DUT. As such, the formation of the chamber allows the DUT to be stably maintained under specific conditions (e.g., a predetermined temperature or pressure) during testing or probing. As a result, testing or probing of the DUT can be improved. Furthermore, the chamber formed by the shielding member is a very small chamber (e.g. compared with the shielding chamber for the whole probing system, or the shielding chamber for the chuck and the semiconductor wafer on the chuck), it would be easier to control and maintain the DUT in specific conditions and thus cost can also be reduced.

Figure 1:
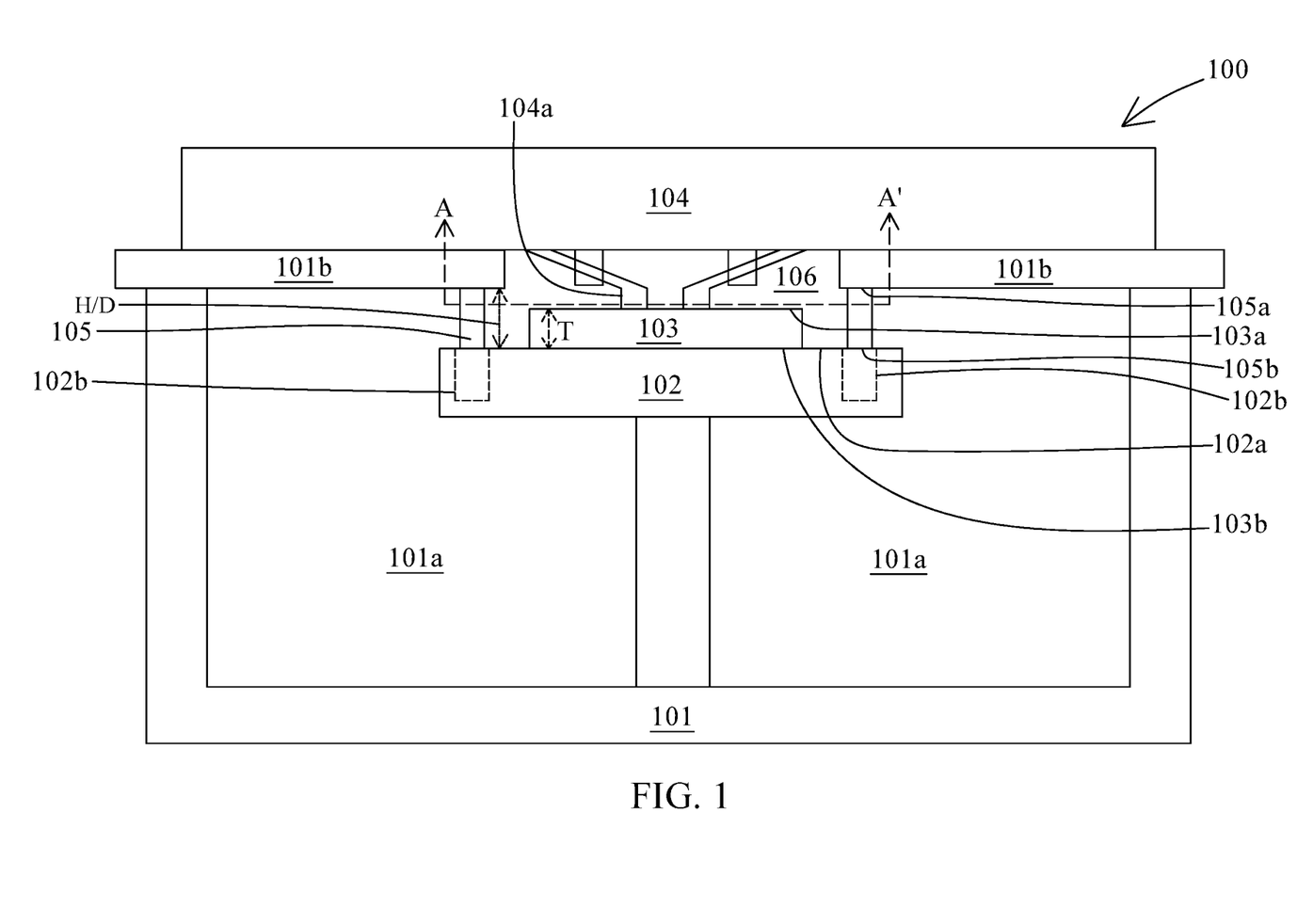
FIG. 1 is a schematic cross-sectional view of a first probing system in accordance with some embodiments of the present disclosure.

FIG. 1 is a schematic cross-sectional view of a first probing system 100 in accordance with various embodiments of the present disclosure. In some embodiments, the first probing system 100 is configured to perform testing on a device under test (DUT) 103. In some embodiments, the first probing system 100 includes a housing 101, a chuck 102 disposed within the housing 101, and a probe card 104 disposed over the chuck 102.

In some embodiments, the housing 101 defines a first chamber 101a, and the chuck 102 is disposed in the first chamber 101a. In some embodiments, the housing 101 includes a platen 101b over the top of the housing 101. In some embodiments, the platen 101b is a platform for holding and supporting the probe card 104 thereon. In some embodiments, the platen 101b includes a flat surface for supporting the probe card 104 thereon. In some embodiments, the platen 101b is disposed between the chuck 102 and the probe card 104.

In some embodiments, the chuck 102 is configured to hold and support the DUT 103. In some embodiments, the chuck 102 is rotatable about a center of the chuck 102 and is movable toward and away from the probe card 104. In some embodiments, the chuck 102 has a circular, quadrilateral or polygonal shape. In some embodiments, the chuck 102 includes a surface 102a facing toward the probe card 104.

In some embodiments, the DUT 103 is disposed on the chuck 102 during probing or testing operations. In some embodiments, the DUT 103 is held on the chuck 102 by using suction to draw the DUT 103 toward the chuck 102. In some embodiments, the DUT 103 includes circuitry formed thereon. In some embodiments, several test pads for testing operations are formed over the DUT 103.

In some embodiments, the DUT 103 includes a front side 103a and a back side 103b opposite to the front side 103a. In some embodiments, circuitry or device is formed over the front side 103a. In some embodiments, the test pads are formed over the front side 103a. In some embodiments, the back side 103b of the DUT 103 contacts the chuck 102. In some embodiments, the back side 103b contacts the surface 102a of the chuck 102. In some embodiments, the back side 103b is a substantially planar surface. In some embodiments, the DUT 103 is a semiconductor device, a semiconductor structure, a wafer, a chip or the like.

In some embodiments, the probe card 104 is disposed over the platen 101b and above the chuck 102 and the DUT 103. In some embodiments, the probe card 104 includes a circuit board for testing the DUT 103. In some embodiments, the probe card 104 is a manipulator, a positioner or the like. In some embodiments, a supporter is disposed on the circuit board, and several probes 104a are fixed on the supporter with epoxy resin and protrude from the probe card 104 toward the chuck 102. In some embodiments, the probe card 104 includes several probe manipulators with a single probe. In some embodiments, a tip of each probe 104a is configured to contact the test pad disposed over the DUT 103. In some embodiments, the circuitry of the DUT 103 is electrically connected to the circuit board of the probe card 104 through the probes 104a. In some embodiments, a cover is disposed over the probe card 104 to enclose the probe card 104 to ensure a complete shielding of the chuck 102 and the DUT 103 from the surroundings.

In some embodiments, the chuck 102 includes a shielding member 105 disposed between the platen 101b and the chuck 102. In some embodiments, the shielding member 105 protrudes from the chuck 102 toward the platen 101b. In some embodiments, the shielding member 105 protrudes from a surrounding of the chuck 102. In some embodiments, the shielding member 105 protrudes from the surface 102a of the chuck 102. In some embodiments, the shielding member 105 is substantially orthogonal to the surface 102a of the chuck 102. In some embodiments, the shielding member 105 is in contact with the platen 101b. In some embodiments, the shielding member 105 extends between the surface 102a of the chuck 102 and the platen 101b. In some embodiments, the shielding member 105 encircles the chuck 102. In some embodiments, the probes 104a of the probe card 104 can touch the DUT 103. In some embodiments, the shielding member 105 is in contact with the platen 101b to provide a complete isolation of the chuck 102 from the surroundings.

In some embodiments, the shielding member 105 includes a first end 105a and a second end 105b opposite to the first end 105a. The first end 105a is in contact with the platen 101b, and the second end 105b is in contact with the chuck 102. In some embodiments, the second end 105b is disposed under or on the surface 102a of the chuck 102. In some embodiments, the shielding member 105 is isolated from the probe card 104. In some embodiments, the shielding member 105 is isolated from the platen 101b.

Figure 2:
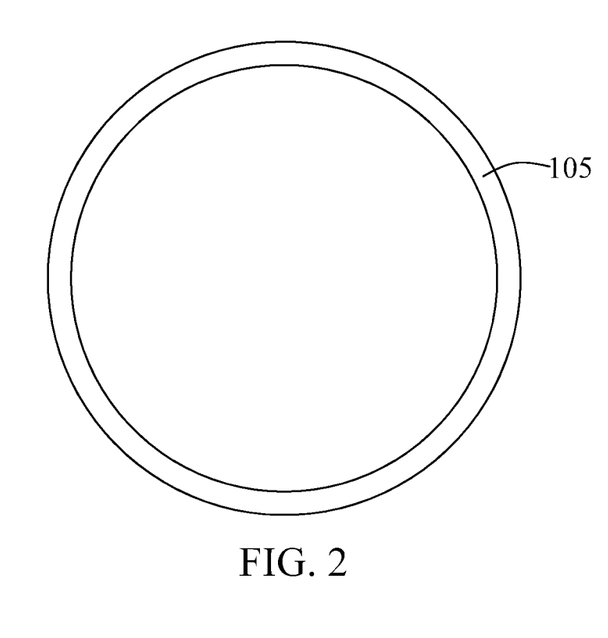
FIGS. 2 and 3 are exemplary embodiments of a cross-sectional view of a shielding member along a line AA' in FIG. 1.
Figure 3:
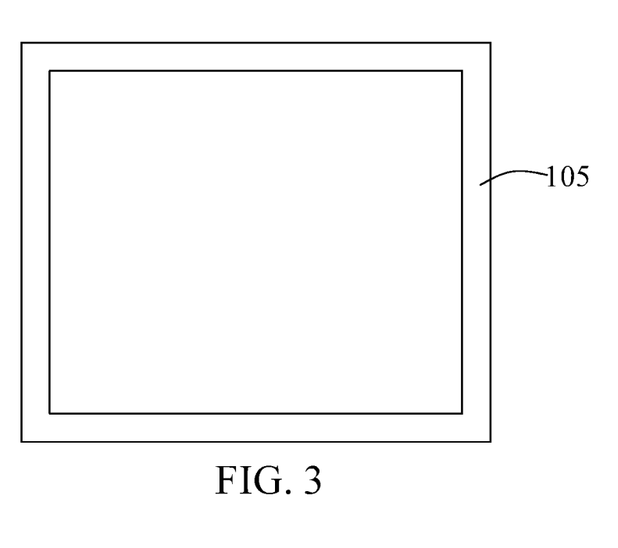

In some embodiments, a height H of the shielding member 105 is substantially same as a distance D between the chuck 102 and the platen 101b. In some embodiments, the height H of the shielding member 105 is substantially greater than a thickness T of the DUT 103. In some embodiments, the shielding member 105 is extendable or depressible along its height. In some embodiments, the height H is substantially greater than the thickness T in order to ensure a sufficient clearance between the DUT 103 and the platen 101b. In some embodiments, a cross section of the shielding member 105 along a line AA' has a circular shape (as shown in FIG. 2), a quadrilateral shape (as shown in FIG. 3) or a polygonal shape.

In some embodiments, a second chamber 106 is defined by the chuck 102, the shielding member 105, the platen 101b and the probe card 104. In some embodiments, the DUT 103 is disposed within the second chamber 106 and surrounded by the shielding member 105. In some embodiments, a temperature of the second chamber 106 is substantially different from or greater than a temperature of the first chamber 101a. In some embodiments, a pressure in the second chamber 106 is substantially different from or greater than a pressure of the first chamber 101a. In some embodiments, the first chamber 101a and the second chamber 106 are isolated from each other by the shielding member 105. In some embodiments (for example, as illustrated in FIGS. 1, 4 and 6-10), the second chamber 106 is much smaller than the first chamber 101a.

In some embodiments, the shielding member 105 is moveable relative to the chuck 102. In some embodiments, the shielding member 105 is extendable from and retractable into the chuck 102. In some embodiments, the shielding member 105 is extendable from the chuck 102 toward the platen 101b until the shielding member 105 is in contact with the platen 101b and the second chamber 106 is formed. In some embodiments, the shielding member 105 is retractable to separate from the platen 101b until the shielding member 105 is disposed in the chuck 102. In some embodiments, the shielding member 105 is a circumferential fixture of the chuck 102. In some embodiments, the shielding member 105 is a part of the chuck 102.

In some embodiments, the chuck 102 includes a slot 102b formed in the chuck 102 and configured to allow the shielding member 105 to be wholly or partially disposed within the slot 102b. In some embodiments, the slot 102b indents into an edge of the chuck 102. In some embodiments, the shielding member 105 is extended almost entirely out of the slot 102b when the shielding member 105 is in an extended status. In some embodiments, the shielding member 105 is disposed entirely within the slot 102b when the shielding member 105 is in a retracted status.

Because the second chamber 106 is isolated from the first chamber 101a when the shielding member 105 is in the extended status, the DUT 103 can be maintained in specific conditions (e.g., a predetermined temperature or pressure) during testing or probing of the DUT 103. As a result, testing or probing of the DUT 103 can be improved. Furthermore, since the second chamber 106 is a small chamber (e.g. compared with the first chamber 101a), it would be easier to control and maintain the DUT 103 in specific conditions and thus cost can also be reduced. In some embodiments, if application requires, a vacuum suction is applied in order to increase shielding between the chuck 102 and the surroundings.

Figure 4:
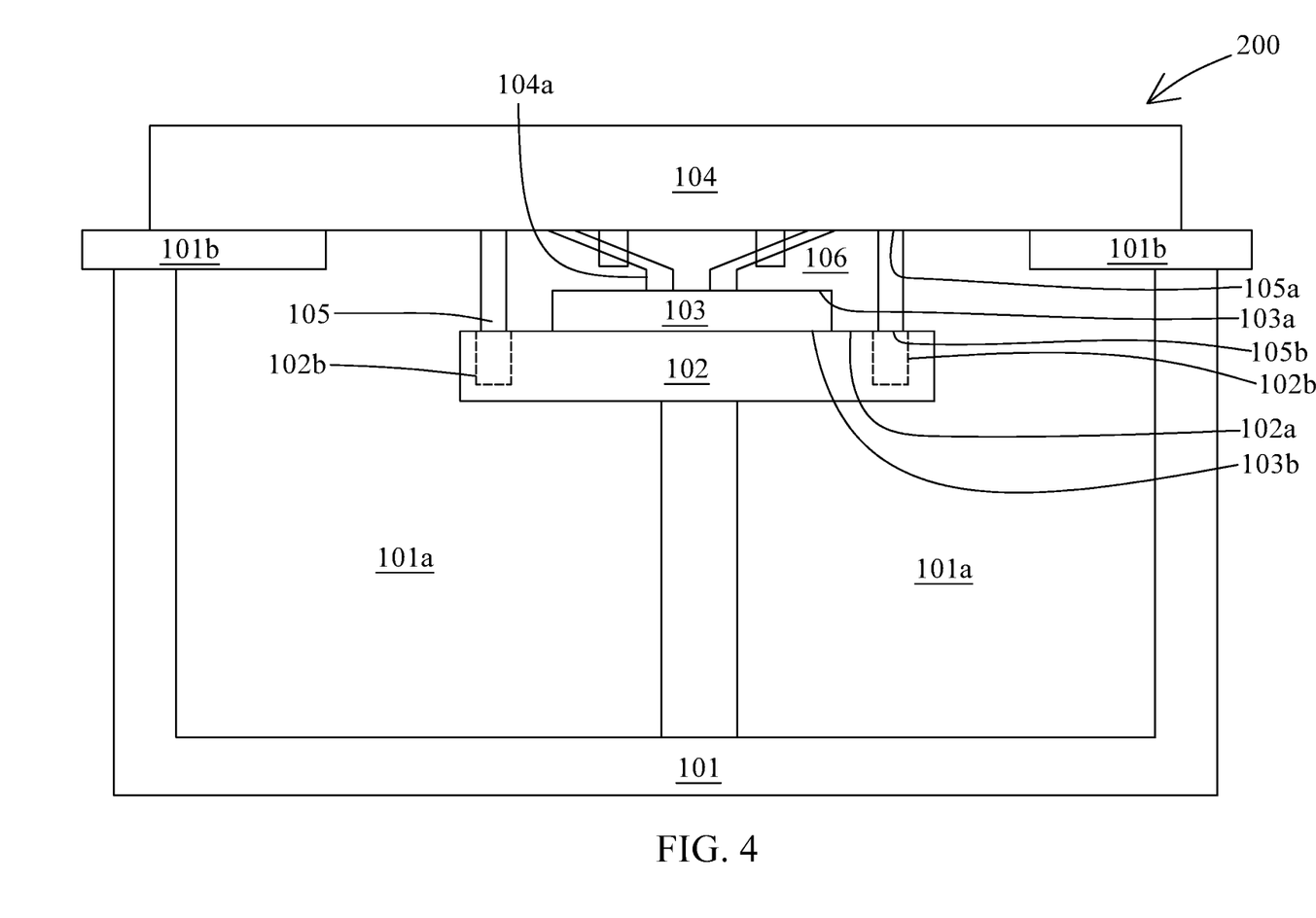
FIG. 4 is a schematic cross-sectional view of a second probing system in accordance with some embodiments of the present disclosure.

FIG. 4 is a schematic cross-sectional view of a second probing system 200 in accordance with various embodiments of the present disclosure. In some embodiments, the second probing system 200 is configured in a manner similar to that of the first probing system 100 as illustrated in FIG. 1.

In some embodiments, the shielding member 105 of the second probing system 200 is disposed between the probe card 104 and the chuck 102. In some embodiments, the shielding member 105 is extendable from the chuck 102 toward the probe card 104. In some embodiments, the shielding member 105 is in contact with the probe card 104. In some embodiments, a height H of the shielding member 105 is substantially greater than a distance D between the chuck 102 and the platen 101b.

Figure 5:
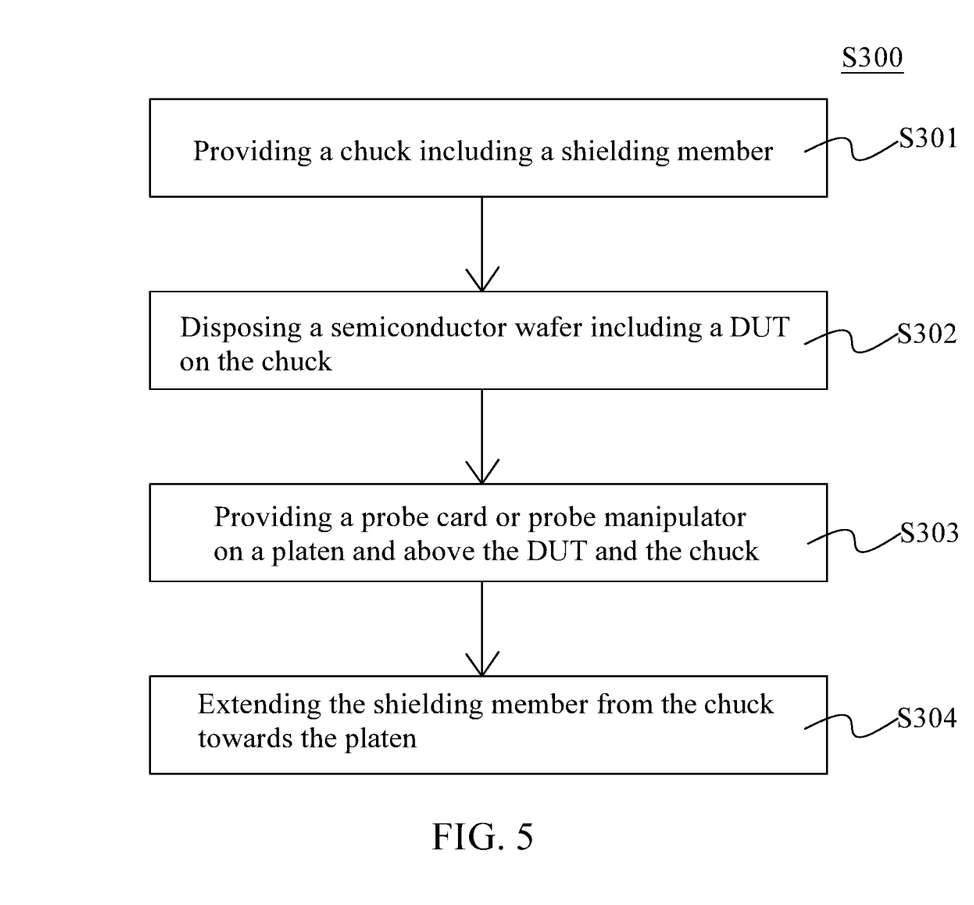
FIG. 5 is a flowchart representing a method of operating a probing system according to aspects of the present disclosure in one or more embodiments.

In the present disclosure, a method S300 of operating a probing system 100 or 200 is disclosed. The method S300 includes a number of operations and the description and illustrations are not deemed as a limitation of the sequence of the operations. FIG. 5 is a flowchart depicting an embodiment of the method S300 of operating the probing system 100 or 200. The method includes steps S301, S302, S303 and S304.

Figure 6:
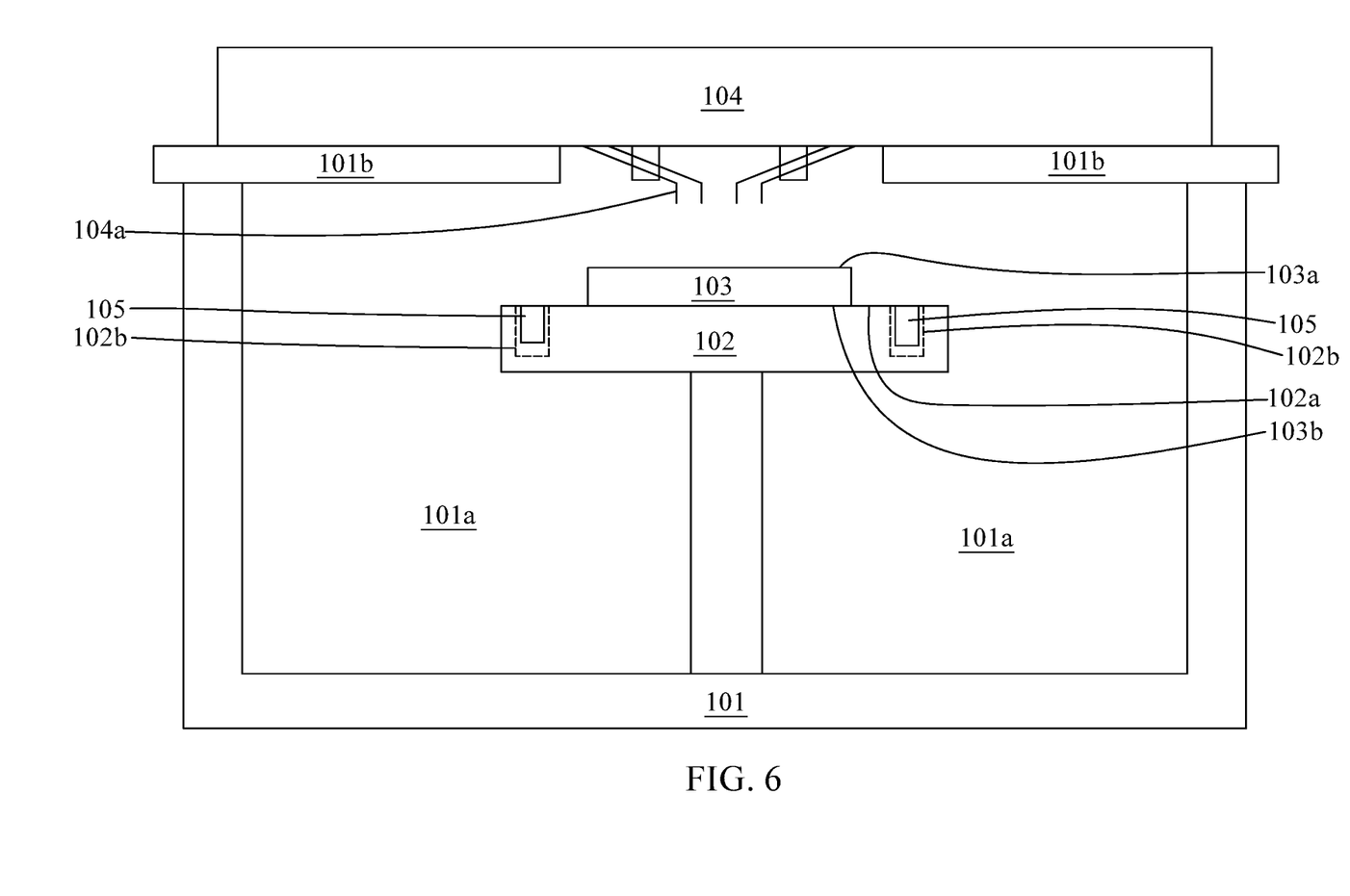
FIGS. 6 to 10 are schematic views of operating a probing system by a method of FIG. 5 in accordance with some embodiments of the present disclosure.

In step S301, a chuck 102 including a shielding member 105 is provided as shown in FIG. 6. In some embodiments, the probing system 100 includes the chuck 102 disposed within a housing 101 or a first chamber 101a. In some embodiments, the shielding member 105 is in a retracted status and initially disposed within the chuck 102. In some embodiments, the shielding member 105 is disposed within a slot 102b of the chuck 102.

In step S302, a DUT 103 is disposed on the chuck 102 as shown in FIG. 6. In some embodiments, a semiconductor wafer including a DUT 103 is disposed on the chuck 102. In some embodiments, the DUT 103 is disposed by using suction to draw the DUT 103 toward the chuck 102. In some embodiments, a back side 103b of the DUT 103 is in contact with a surface 102a of the chuck 102.

In step S303, a probe card 104 is provided as shown in FIG. 6. In some embodiments, the probe card 104 or probe manipulator is disposed on a platen 101b and above the DUT 103 and the chuck 102. In some embodiments, the probe card 104 includes several probes 104a protruding from the probe card 104 and configured to probe the DUT 103. In some embodiments, the probe card 104 is disposed above the front side 103a of the DUT 103.

Figure 7:
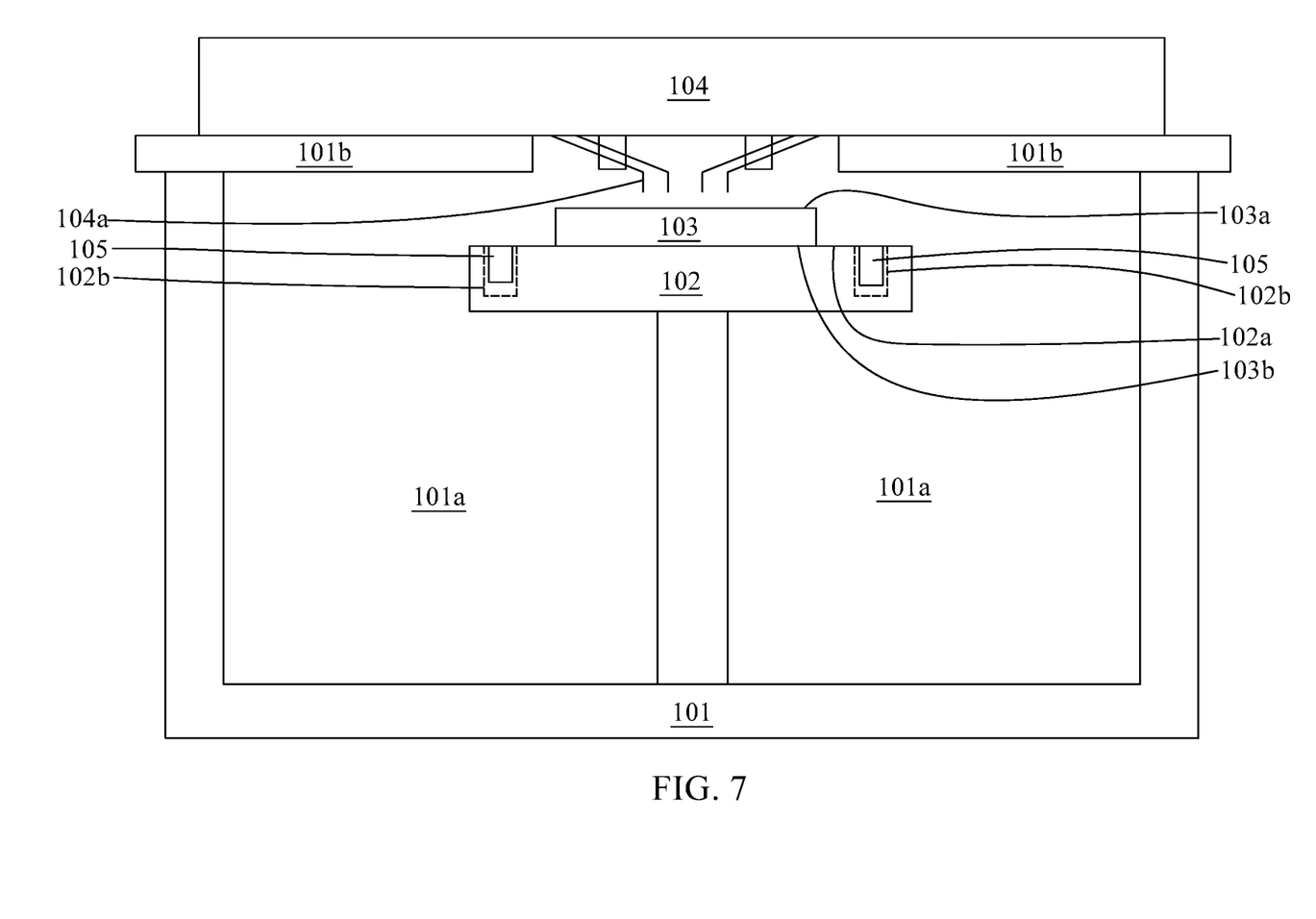

In some embodiments, the chuck 102 is moved toward the probe card 104 after the disposing of the DUT 103 as shown in FIG. 7. In some embodiments, after the disposing of the DUT 103 on the chuck 102, the chuck 102 is moved toward the probe card 104 so that the chuck 102 and the DUT 103 are proximal to the probe card 104.

Figure 8:
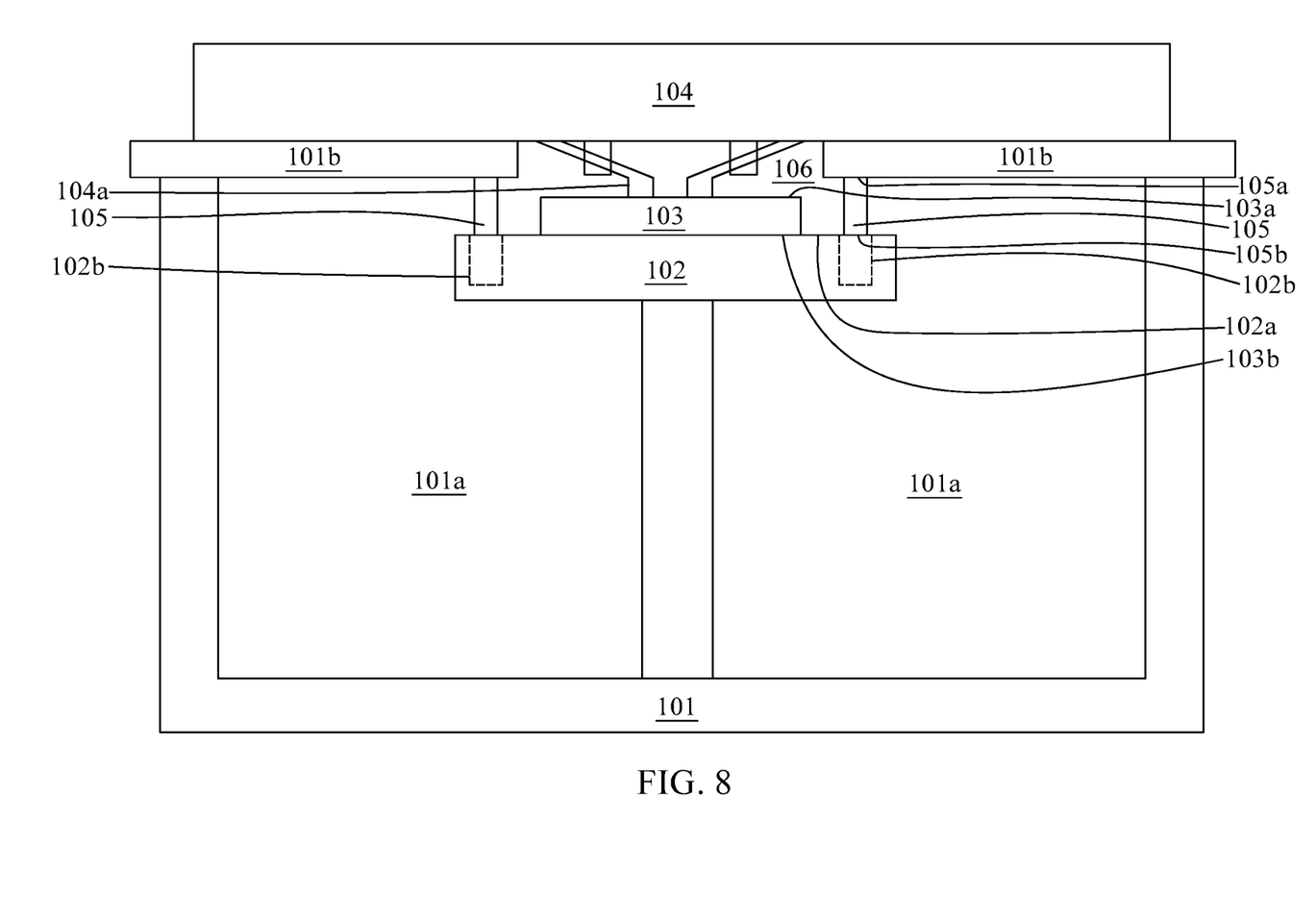

In step S304, the shielding member 105 is extended from the chuck 102 toward the platen 101b as shown in FIG. 8. In some embodiments, after the disposing of the DUT 103 or the movement of the chuck 102, the shielding member 105 is extended from the chuck 102 toward the platen 101b. In some embodiments, the shielding member 105 is extendable from and retractable into the chuck 102. In some embodiments, the shielding member 105 is extended from the chuck 102 until the shielding member 105 is in contact with the platen 101b to form a second chamber 106 defined by the chuck 102, the shielding member 105, the platen 101b and the probe card 104.

Figure 9:
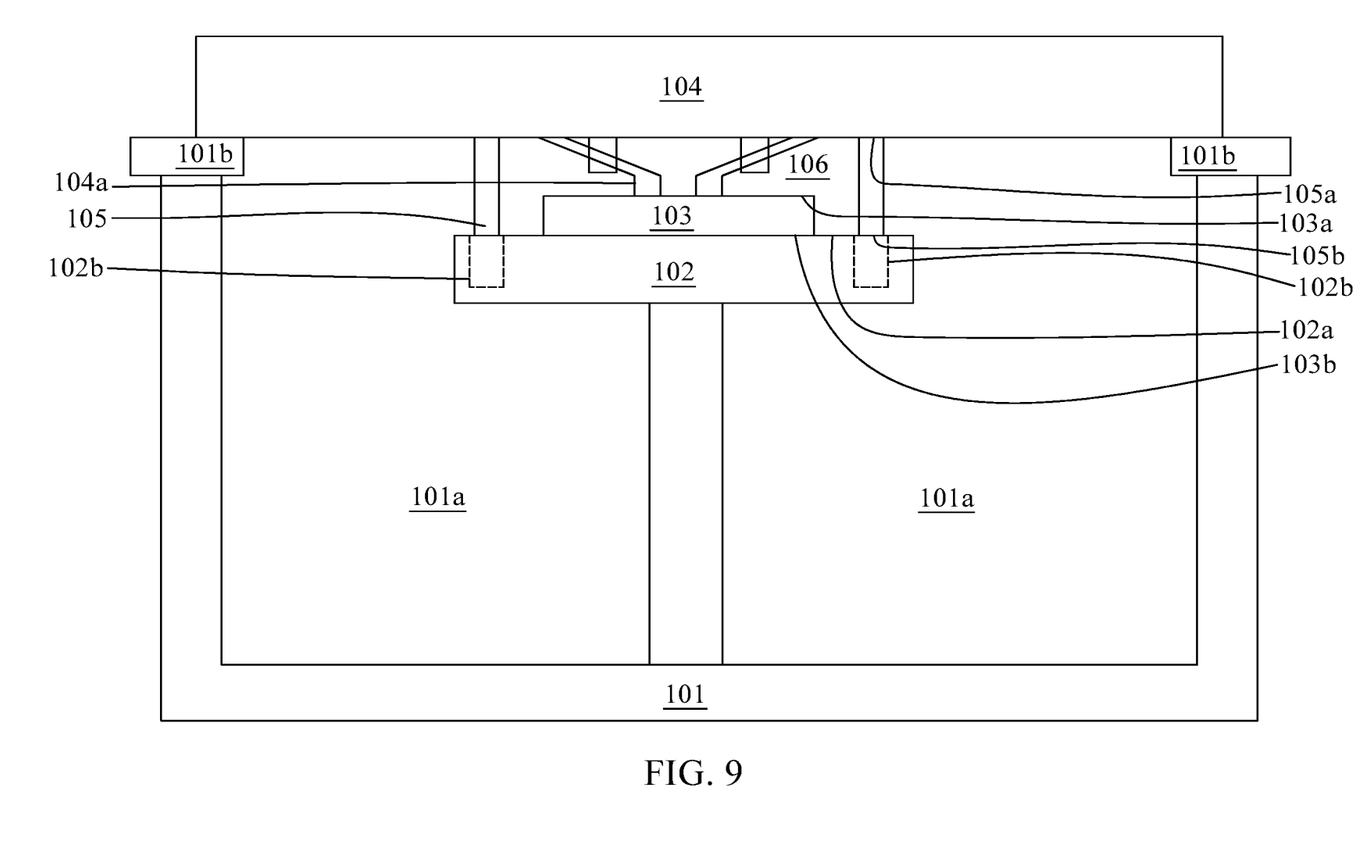

In some embodiments, the shielding member 105 is extended from the chuck 102 toward the probe card 104 as shown in FIG. 9. In some embodiments, after the disposing of the DUT 103 or the movement of the chuck 102, the shielding member 105 is extended from the chuck 102 toward the probe card 104. In some embodiments, the shielding member 105 is extended from the chuck 102 until the shielding member 105 is in contact with the probe card 104 to form a second chamber 106 defined by the chuck 102, the shielding member 105 and the probe card 104.

In some embodiments, the chuck 102 is further moved toward the probe card 104 after the extension of the shielding member 105. In some embodiments, the shielding member 105 does not move during the further movement of the chuck 102. In some embodiments, by further moving the chuck 102 toward the probe card 104, the probes 104a of the probe card 104 are caused to contact the DUT 103. In some embodiments, the chuck 102 is moved towards the probe card 104 prior to the extension or retraction of the shielding member 105.

After the extension of the shielding member 105 and the further movement of the chuck 102, the DUT 103 is probed by the probes 104a. In some embodiments, the probes 104a contact the front side 103a of the DUT 103 for testing the DUT 103. In some embodiments, several test pads on the DUT 103 contact the corresponding probes 104a. During the probing or testing, a testing signal is transmitted to the DUT 103 through the probes 104a, and a response signal from the DUT 103 is transmitted back to the probes 104a.

In some embodiments, after the formation of the second chamber 106 and before the probing or testing of the DUT 103, a temperature of the second chamber 106 is increased or decreased. In some embodiments, a pressure of the second chamber 106 is increased or decreased. In some embodiments, the second chamber 106 is filled with an inert gas such as nitrogen. In some embodiments, the pressure of the second chamber 106 is increased or decreased by filling with air or gas(es) of higher or lower pressure relative to the surroundings. In some embodiments, a humidity of the second chamber 106 is increased or decreased by filling with air of varying wetness. As such, the DUT 103 can be tested or probed under specific conditions such as high temperature, high pressure, etc. within the second chamber 106. The second chamber 106 can be easily maintained in predetermined conditions.

Figure 10:
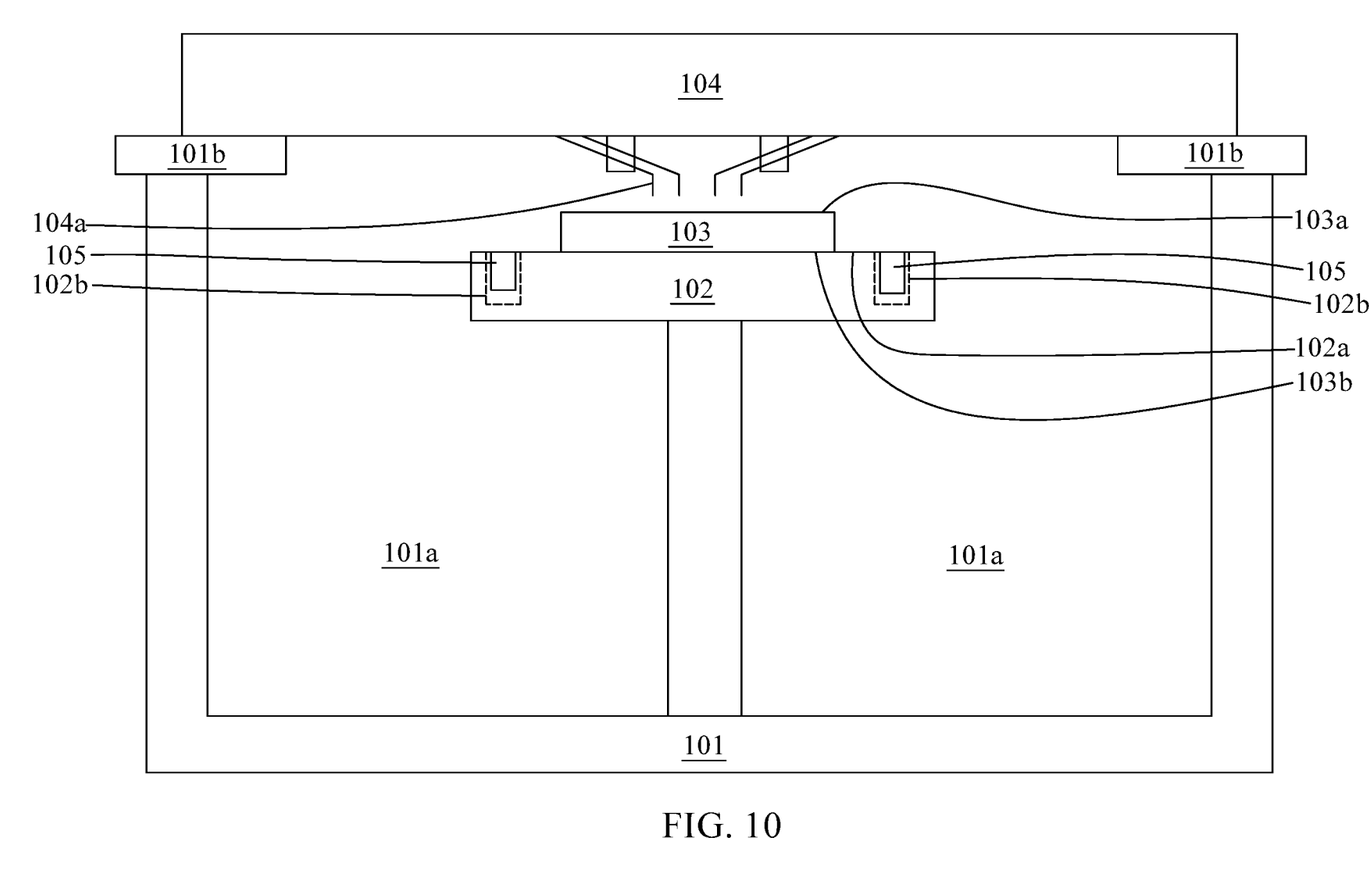

In some embodiments, after the probing or testing of the DUT 103, the shielding member 105 is retracted into the chuck 102 as shown in FIG. 10. In some embodiments, the shielding member 105 retracts until the shielding member 105 is disposed in the chuck 102 or the slot 102b. In some embodiments, the retraction of the shielding member 105 is performed automatically. In some embodiments, the retraction of the shielding member 105 is performed by raising the chuck 102 towards or into the platen 101b. In some embodiments, the chuck 102 is moved away from the probe card 104 prior to the retraction of the shielding member 105. The chuck 102 is moved away from the probe card 104 such that the probes 104a no longer touch the DUT 103, and then the shielding member 105 is retracted into the chuck 102.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:
1. A probing system comprising:
a chuck configured to support a device under test (DUT);

a probe card disposed above the chuck and including a plurality of probes protruding from the probe card toward the chuck and the DUT; and a platen disposed between the chuck and the probe card and configured to support the probe card, wherein the chuck includes a shielding member disposed between the platen and the chuck and surrounding the DUT, and the shielding member is extendable from and retractable into the chuck.

2. The probing system of claim 1, wherein the shielding member protrudes from the chuck toward the platen.

3. The probing system of claim 1, wherein the chuck includes a slot indented into the chuck and configured to allow the shielding member to be wholly or partially disposed within the slot.

4. The probing system of claim 1, wherein the shielding member is in contact with the platen.

5. The probing system of claim 1, wherein the shielding member is substantially orthogonal to a surface of the chuck.

6. The probing system of claim 1, wherein a height of the shielding member is substantially same as a distance between the chuck and the platen.

7. The probing system of claim 1, wherein a height of the shielding member is substantially greater than a thickness of the DUT.

8. The probing system of claim 1, wherein the DUT is disposed within a chamber defined by the chuck, the shielding member, the platen and the probe card.

9. The probing system of claim 1, wherein the shielding member includes a first end and a second end opposite to the first end, the first end is in contact with the platen, and the second end is in contact with the chuck.

10. The probing system of claim 1, wherein the shielding member contacts the probe card.

11. The probing system of claim 1, wherein the shielding member is isolated from the probe card.

12. A method of operating a probing system, comprising:
providing a chuck including a shielding member extendable from the chuck and disposed in the chuck;
disposing a device under test (DUT) on the chuck and surrounded by the shielding member;
providing a probe card above the DUT and the chuck, and disposing a platen disposed between the probe card and the chuck; and
extending the shielding member from the chuck toward the platen, thereby the shielding member contacts the platen or the probe card.

13. The method of claim 12, further comprising retracting the shielding member into the chuck and away from the platen.

14. The method of claim 13, wherein the extension of the shielding member is performed prior to the retraction of the shielding member.

15. The method of claim 12, wherein a chamber defined by the chuck, the shielding member, the platen and the probe card is formed after the extension of the shielding member.

16. The method of claim 15, further comprising increasing or decreasing a temperature of the chamber; or filling the chamber with an inert gas.

17. The method of claim 12, further comprising moving the chuck toward the probe card prior to the extension of the shielding member.

18. The method of claim 12, further comprising probing the DUT after the extension of the shielding member.

19. The method of claim 18, wherein the shielding member is retracted into the chuck after the probing of the DUT.

* * * * *